(12) United States Patent
Tolshikhin et al.

(10) Patent No.: US 7,532,784 B2
(45) Date of Patent: May 12, 2009

(54) INTEGRATED VERTICAL WAVELENGTH (DE)MULTIPLEXER

(75) Inventors: Valery I. Tolshikhin, Ottawa (CA); Fang Wu, Ottawa (CA)

(73) Assignee: OneChip Photonics Inc., Ottawa, Ontario (CA)

( * ) Notice: Subject to any disclaimer, the term of this patent is extended or adjusted under 35 U.S.C. 154(b) by 0 days.

(21) Appl. No.: 11/882,126

(22) Filed: Jul. 31, 2007

(65) Prior Publication Data
US 2008/0080808 A1    Apr. 3, 2008

Related U.S. Application Data

(60) Provisional application No. 60/834,162, filed on Jul. 31, 2006.

(51) Int. Cl.
*G02B 6/12* (2006.01)
(52) U.S. Cl. .............................. 385/14; 385/24; 385/50
(58) Field of Classification Search ........................ None
See application file for complete search history.

(56) References Cited

U.S. PATENT DOCUMENTS

| | | | | |
|---|---|---|---|---|
| 4,318,058 A | * | 3/1982 | Mito et al. | 372/50.12 |
| 4,701,009 A | * | 10/1987 | Tangonan et al. | 385/14 |
| 5,031,188 A | | 7/1991 | Koch et al. | |
| 5,060,235 A | | 10/1991 | Ikeda | |
| 5,140,149 A | * | 8/1992 | Sakata et al. | 257/436 |
| 5,144,637 A | | 9/1992 | Koch et al. | |
| 5,170,402 A | | 12/1992 | Ogita et al. | |
| 5,274,649 A | | 12/1993 | Hirayama et al. | |
| 5,502,783 A | * | 3/1996 | Wu | 385/42 |
| 5,559,912 A | * | 9/1996 | Agahi et al. | 385/42 |
| 5,712,864 A | | 1/1998 | Goldstein et al. | |
| 5,917,974 A | * | 6/1999 | Tavlykaev et al. | 385/50 |

(Continued)

OTHER PUBLICATIONS

M. Raburn et al. InP-InGaAsP wafer-bonded vertically coupled X-crossing multiple channel optical add-drop multiplexer. IEEE Photonics Technology Letters 13:6:579-581, Jun. 2001.*

(Continued)

*Primary Examiner*—Sung H Pak
*Assistant Examiner*—Mike Stahl
(74) *Attorney, Agent, or Firm*—Freedman & Associates

(57) ABSTRACT

The invention describes an integrated-photonics arrangement, implementable in a multi-layer III-V semiconductor structure, which has a semiconductor substrate; an epitaxial semiconductor structure grown on this substrate in one growth step; a common waveguide; and a plurality of wavelength-designated waveguides; all the waveguides being formed in this epitaxial structure using conventional semiconductor processing techniques. Each waveguide being defined by the bandgap wavelength of its core region and all the waveguides being arranged vertically in order of ascending bandgap wavelength; with the common waveguide placed at the bottom of the structure and the wavelength-designated waveguide having the longest bandgap wavelength placed at the top of the structure. In use, the bandgap wavelength of the common waveguide being well below any operating wavelength, therefore providing conditions for low-loss propagation of each operating wavelength to its designated waveguide through the common waveguide. The invention discloses a method of wavelength demultiplexing (multiplexing) for optical signals in a plurality of wavelengths, which are co- or bi-directionally propagating within the integrated-photonics arrangement, by vertical splitting them from (combining them into) the common waveguide into (from) wavelength designated waveguides.

9 Claims, 6 Drawing Sheets

U.S. PATENT DOCUMENTS

| | | | |
|---|---|---|---|
| 6,072,925 | A | 6/2000 | Sakata |
| 6,228,670 | B1 * | 5/2001 | Kudo ........................... 438/31 |
| 6,310,995 | B1 * | 10/2001 | Saini et al. .................... 385/28 |
| 6,510,266 | B2 * | 1/2003 | Lauzon et al. ................ 385/40 |
| 6,795,622 | B2 * | 9/2004 | Forrest et al. ................. 385/50 |
| 2003/0026515 | A1 * | 2/2003 | Barenburg et al. ............ 385/14 |
| 2004/0096175 | A1 * | 5/2004 | Tolstikhin ................... 385/131 |
| 2005/0249504 | A1 | 11/2005 | O'Donnell et al. |
| 2006/0039666 | A1 | 2/2006 | Knights et al. |

OTHER PUBLICATIONS

S. Han. Narrowband wavelength demultiplexer using weighted coupling vertical couplers. LEOS ' 97 Conference Proceedings, vol. 1, pp. 326-327, Nov. 1997.*

S. Han et al. Narrow-band vertically stacked filters in InGaAlAs/InP at 1.5 μm. Journal of Lightwave Technology 14:1:77-83, Jan. 1996.*

C. Wu et al. A vertically coupled InGaAsP/InP directional coupler filter of ultranarrow bandwidth. IEEE Photonics Technologty Letters 3:6:519-521, Jun. 1991.*

S.-K. Han, et al, "Narrowband wavelength demultiplexer using weighted coupling vertical couplers", LEOS '97 Conference Proceedings, vol. 1, pp. 326-327, Nov. 1997.

S.-K. Han, et al., "Narrow-Band Vertically Stacked Filters in InGaAlAs/InP at 1.5 μm", J. Lightwave Technol.., vol. 14, No. 1, pp. 77-79, 1996.

C. Wu, et al., "A Vertically Coupled InGaAsP/InP Directional Coupler Filter of Ultra-narrow Bandwidth", IEEE Photon. Technology Lett., vol. 3, No. 6, pp. 519-521, 1991.

R. C. Alferness, et al., "Grating-assisted InGaASP/InP vertical co-directional coupler filter", Appl. Phys. Lett., vol. 55, p. 2011, 1989.

N. Nakajima, et al, "Full-Duplex Operation of an In-Line Transceiver Emitting at 1.3 mm and receiving at 1.55 mm", Electronic Lett., vol. 32, No. 5, pp. 473-474, 1996.

V. I. Tolstikhin, "Optical properties of semiconductor heterostructures for active photonic device modeling," J. Vac. Science & Technology A, vol. A18, pp. 605-609, 2000.

J. Taylor and V. I. Tolstikhin, "Intervalence band absorption in InP and related materials for optoelectronic device modeling," J. Appl. Phys. vol. 87, pp. 1054-1059, 2000.

V. Magnin, et al, "Design and Optimization of a 1.3/1.55-mm Wavelength Selective p-i-n Photodiode Based on Multimode Diluted Waveguide", IEEE Photon. Technol. Lett., vol. 17, No. 2, pp. 459-461, 2005.

C.-W. Lee et al., "Asymmetric Waveguides Vertical Couplers for Polarization-Independent Coupling and Polarization-Mode Splitting", J. Lightwave Technol., vol. 23, No. 4, pp. 1818-1826, 2005.

Xia et al. "Monolithic Integration of a semiconductor optical amplifier and a high bandwidth p-i-n-photodiode using asymmetric twin-waveguide technology", IEEE Technology Letters, vol. 15, Issue 3, pp. 452-454, (Mar. 2003).

Lee et al. "Design of Vertical Polarization-mode Splitter with Mode-Size Transformer", IEEE, Photonics Tech Letters, vol. 16, Issue. 9, pp. 2069-2071, (Sep. 2004).

Kang et al. Optical coupling analysis of dual-waveguide structure for monolithic integration of photonic devices, IEEE Photonics Tech Letters, vol. 17, Issue 11, pp. 2304-2306, (Nov. 2005).

International Search Report of PCT/CA2007/001348 mailed Nov. 9, 2007.

* cited by examiner

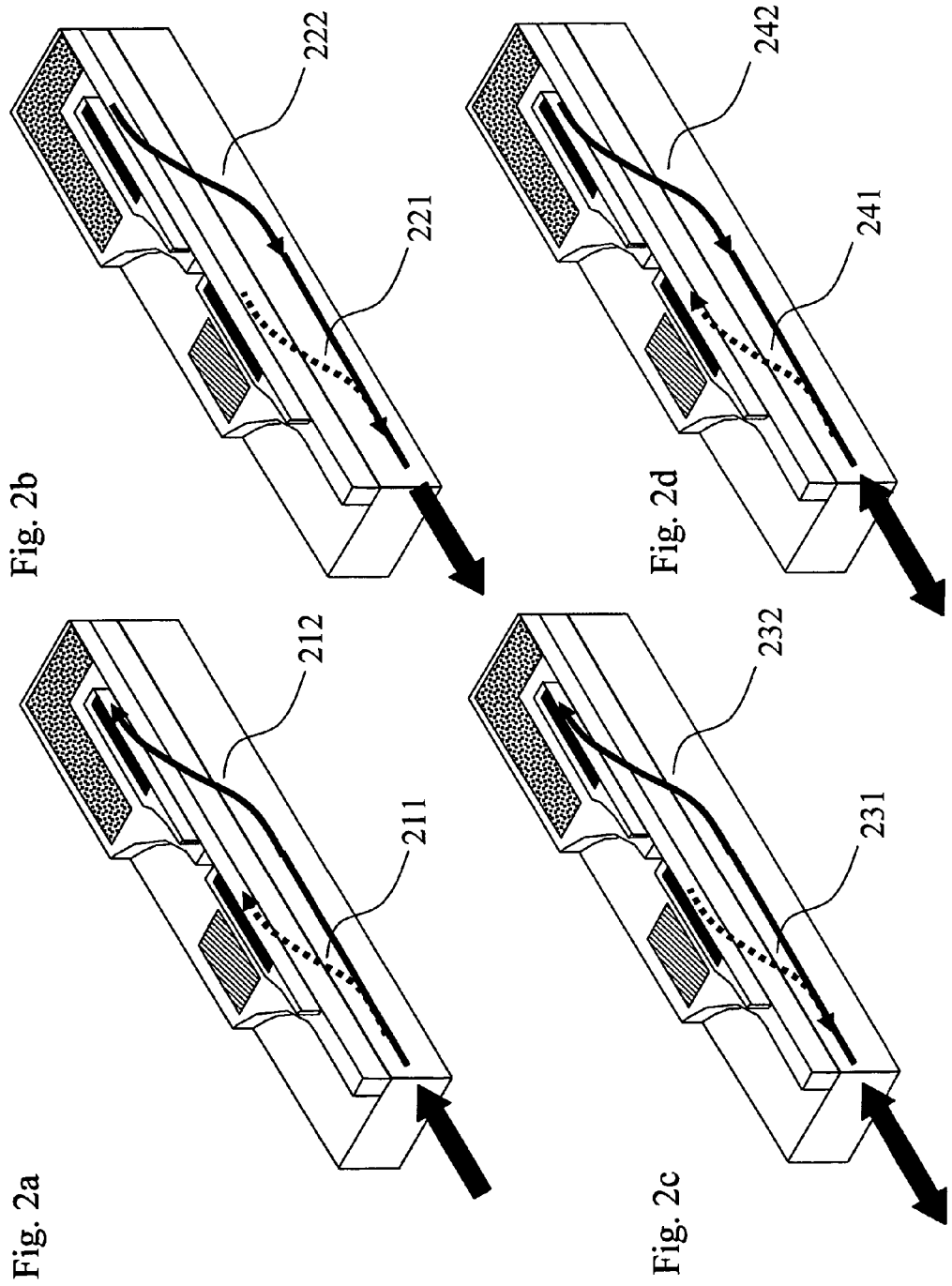

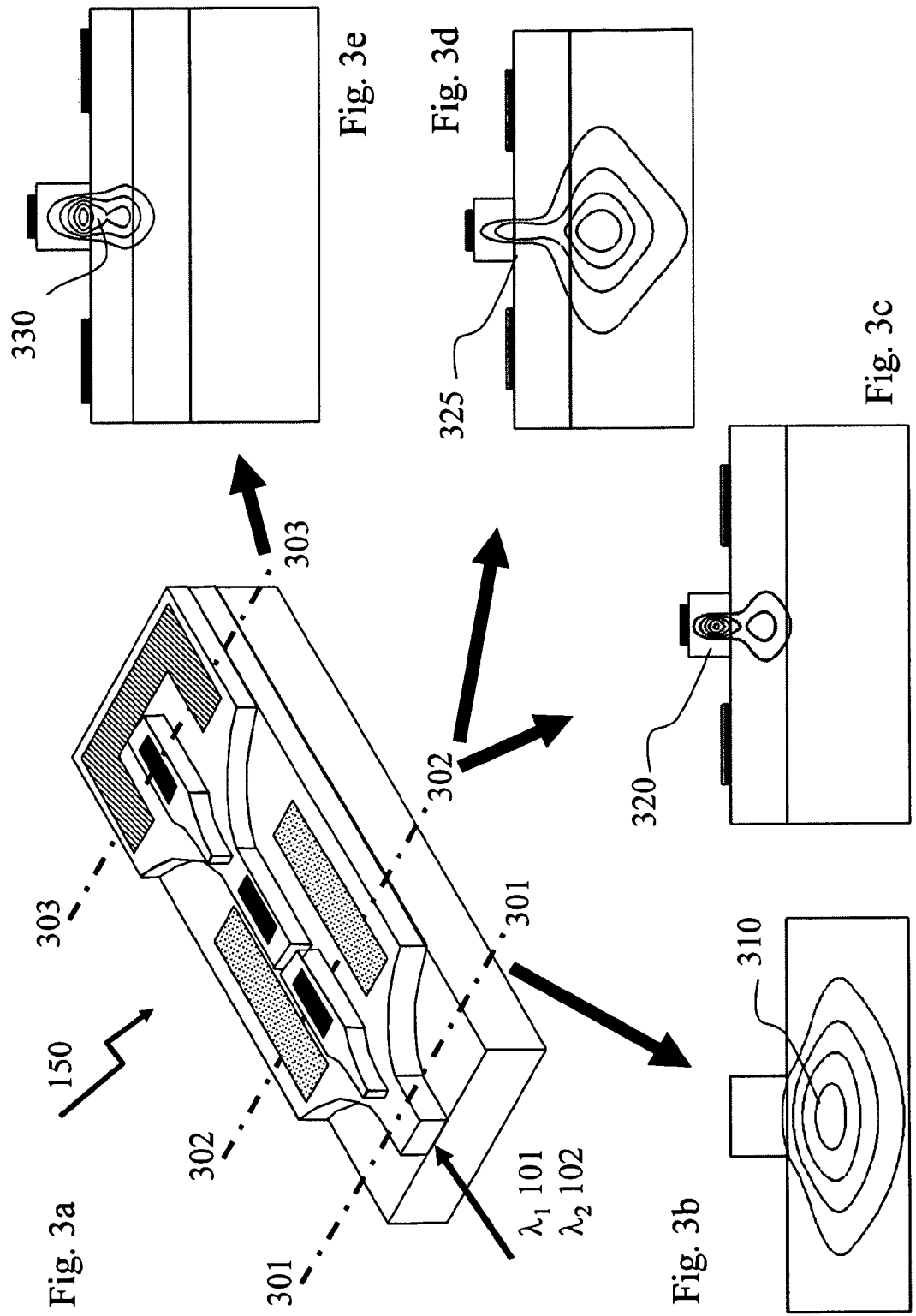

INTEGRATED VERTICAL WAVELENGTH (DE)MULTIPLEXER

This application claims the benefit of U.S. Provisional Patent Application No. 60/834,162 filed Jul. 31, 2006 the entire contents of which are incorporated herein by reference.

FIELD OF THE INVENTION

The invention relates to the field of integrated photonics, and more particularly to photonic integrated circuits in III-V compound semiconductor materials.

BACKGROUND OF THE INVENTION

Driven by bandwidth hungry applications, optical broadband access networks have advanced very rapidly in the past few years, becoming the core of new triple-play telecommunication services, which deliver data, video and voice on the same optical fiber right to the user's end. Deep penetration of the optical fiber into the access networks is accompanied with massive deployment of the optical gear that drives the traffic along the fiber links. Specifically, optical transceivers, which receive downstream and send upstream data signals, have to be deployed at every optical line terminal or/and network user interface. Therefore, cost efficiency and volume scalability in manufacturing of such components are increasingly becoming the major requirements for their mass production.

Hence photonic integrated circuits (PICs), in which different functionalities are monolithically integrated onto one photonic chip, are an attractive technology and component solution in that they enable the production of complex optical circuits using high volume semiconductor wafer fabrication techniques. This offers the ability to dramatically reduce the component footprint, avoid multiple packaging issues, eliminate multiple optical alignments and, eventually, achieve the unprecedented cost efficiency and volume scalability in mass production of consumer photonics products.

In the context of applications, the advantages of PIC technology become especially compelling when active waveguide devices, such as laser or photodetector, are combined with the passive waveguide devices and the elements of the waveguide circuitry, to form a highly functional photonic system on the chip with minimal, preferably just one, optical input and/or output port. Since the active devices, which emit, detect or intentionally alter (e.g. modulate) optical signals by electrical means, usually all are made from artificially grown semiconductors having bandgap structures adjusted to the function and wavelength range of their particular application, such semiconductors are the natural choice for the base material of the PICs. For example, indium phosphide (InP) and related III-V semiconductors are the common material system for the PICs used in optical fiber communications, since they uniquely allow the active and passive devices operating in the spectral ranges of interest, e.g. the 1310 nm and 1490 nm (or 1555 nm) bands, to be combined onto the same InP substrate.

As the function of any waveguide device within the PIC made up from epitaxially grown semiconductor heterostructures is pre-determined by its band structure and, more particularly by the bandgap wavelength of the waveguide core layer(s) featuring the narrowest bandgap amongst all the waveguide layers, hereafter referred as the waveguide bandgap wavelength, functionally different devices are made from the different, yet compatible, semiconductor materials. This is a fundamental requirement, and one that has a profound impact both on the design and fabrication of the PIC. Monolithic integration of multiple waveguide devices having different waveguide core regions can be achieved in essentially one of the three following ways:

- direct butt-coupling; which exploits the ability to perform multiple steps of epitaxial growth, including selective area etching and re-growth, to provide the desired semiconductor materials, which are spatially differentiated horizontally with a common vertical plane across the PIC die;
- modified butt-coupling; which exploits selective area post-growth modification of semiconductor material grown in a single epitaxial growth run to form the regions of required semiconductor material, also spatially differentiated in the common plane of vertical guiding across the PIC die; and
- evanescent-field coupling; where vertically separated and yet optically coupled waveguides, grown in a single epitaxial growth step, are employed to provide the desired semiconductor materials, which are now differentiated in the common vertical stack of the PIC die.

Whereas each of these three major integration techniques has its own advantages and drawbacks, it is only the last one, hereafter referred to as vertical integration, which allows for each waveguide device to be optimized independently while enabling the entire PIC to be manufactured by using only one epitaxial growth step and standard semiconductor fabrication processes, such dry and wet etching. Therefore, a combination of the design flexibility and suitability for a cost-efficient fabrication approach based on commercially available semiconductor processes makes the vertical integration a unique versatile PIC platform for applications aimed at emerging consumer photonics markets.

An example of such a market in the optical telecom domain is the broadband optical access market, where bidirectional optical transceivers for receiving, processing and sending optical signals in different wavelengths are required at a scale infrequently seen in optical component industry and approaching that of electronic consumer products. Therefore, PIC based optical transceivers for the broadband optical access provide an attractive and natural application for the vertical integration platform.

One major challenge faced by PIC designers using this semiconductor platform is in providing an efficient transition of the optical signals between functionally different and vertically separated optical waveguides, thereby providing compliance to the performance requirements and a robust solution to the variations of high-volume manufacturing processes. In fiber-optics transmission system applications, where optical signals in different wavelength ranges often are to be detected, processed, and emitted in varying combinations within the same photonic circuit, these vertical transitions between functionally and structurally different optical waveguides should additionally be of varying degrees of wavelength specificity, with the wavelength specificity being another variable in the design space of the PIC. In particular, there is a need in the art for the vertical integration to provide a waveguide arrangement, hereafter referred to as vertical wavelength (de)multiplexer (VWM), that allows for vertically combining and splitting the optical signals in the different wavelength ranges, such that, in use, signals in each particular wavelength range are transitioned from the wavelength designated (common) input waveguide into the common (this wavelength designated) output waveguide without significantly interacting with the other wavelength designated waveguides.

Despite the core requirements for such a VWM within PIC technology, there is no known generic solution to the VWM presented in the prior art. The most closely related designs found in the art are related to the wavelength-selective directional coupler and are based upon either resonant grating-assistant coupling (e.g. R. C. Alferness, et al., "Grating-assisted InGaAsP InP vertical co-directional coupler filter", *Appl. Phys. Lett.*, Vol. 55, P. 2011, 1989) or resonant evanescent-field coupling. Resonant evanescent field-coupling is further sub-divided into solutions using planar waveguides (e.g. V. Magnin, et al, "Design and Optimization of a 1.3/1.55-μm Wavelength Selective p-i-n Photodiode Based on Multimode Diluted Waveguide", *IEEE Photon. Technol. Lett.*, Vol. 17, No. 2, pp. 459-461, 2005), straight ridge waveguides (e.g. C. Wu, et al., "A Vertically Coupled InGaAsP/InP Directional Coupler Filter of Ultra-narrow Bandwidth", *IEEE Photon. Technology Lett.*, Vol. 3, No. 6, pp. 519-521, 1991), and tapered ridge waveguides (e.g. C.-W. Lee et al., "Asymmetric Waveguides Vertical Couplers for Polarization-Independent Coupling and Polarization-Mode Splitting", *J. Lightwave Technol.*, Vol. 23, No. 4, pp. 1818-1826, 2005).

Analysis of the resonant grating-assisted designs shows that these are suitable only for narrow wavelength passband applications and require that the grating is formed in the layer(s) separating the vertically integrated waveguides. This precludes the use of a one step epitaxial growth, a significant benefit of the vertical integration platform, which allows for high yield and low cost approach to manufacturing components on III-V semiconductor materials.

In the resonant evanescent-field coupling designs, the transfer between vertically integrated waveguides occurs at pre-determined distance along the propagation axis, this position being specific to the wavelength of the optical signal. This dramatically limits a designers' freedom for designing a circuit but also limits the resonant evanescent-field coupling designs only to the narrow passband applications.

Additionally, any narrow wavelength passband design requires tight fabrication tolerances, as even a minor variation of the epitaxial structure or/and layout of the device may result in a shift of centre wavelength beyond a specified passband and rendering the component useless for the intended application. This may significantly reduce the fabrication yields and, therefore, increase the manufacturing costs of performance compliant PIC components.

It would be advantageous, therefore, to provide a solution removing the constraints of the prior art, by offering increased design, fabrication and utilization flexibilities for the vertical integration approach within III-V semiconductor PIC technologies. It would be further advantageous if the solution was compatible with standard semiconductor materials, exploited an epitaxial semiconductor structure growth approach using only one epitaxial growth step, and supported a plurality of vertically integrated waveguide devices, each waveguide device for operating upon different operating wavelength ranges with the wavelength passband commensurate to the application.

OBJECT OF THE INVENTION

The object of the invention is the non-resonant type, adiabatic VWM for controllable, low-loss transition of the optical signals in a plurality of wavelength ranges, which co- or bi-directionally propagate in the same common waveguide, into a plurality of the vertically separated wavelength designated waveguides, each of which corresponding to a specific wavelength range, such that the common and designated waveguides all are monolithically integrated onto the same semiconductor substrate.

SUMMARY OF THE INVENTION

In accordance with the invention, there are provided a semiconductor substrate, an epitaxial semiconductor structure grown on this substrate in one growth step, a common waveguide with the bandgap wavelength well below any operating wavelength and a plurality of the wavelength designated waveguides with different bandgap wavelengths, all the waveguides formed in this epitaxial structure and vertically integrated in the order of increasing of their bandgap wavelength, laterally defined by semiconductor etch processes and aligned along common propagation direction, wherein the optical signals in a plurality of predetermined wavelength ranges propagating in the common waveguide can be transitioned both from and into this waveguide by transferring the optical signals up and down respectively into and from a plurality of the designated waveguides.

The adiabatic vertical transition of the guided optical signal from a common waveguide to each designated waveguide depends on the wavelength of the optical signal, epitaxial structure and waveguide layout, such that, in use, the transition occurs at a certain distance, as defined by the circuit designer, the longer the bandgap wavelength of the designated waveguide, the farther the guided light in this wavelength propagates in the common waveguide prior to being adiabatically transferred into the appropriate designated waveguide. The design control over the transition of the light in the operating wavelength of each of the designated waveguides between this waveguide and the common waveguide is achieved through multi-level lateral tapering used to match the wave impedance between the two waveguides at a predetermined distance along the propagation direction.

This approach advantageously allows for a vertical splitting/combining of optical signals, which co- or bi-directionally propagate in the common waveguide, between this waveguide and a plurality of the vertically integrated designated waveguides, therefore enabling the waveguide devices operating in different wavelengths to be monolithically integrated onto the same substrate with the common waveguide connected to the input/output optical port or/and other part of optical circuit.

The simplest integrated photonics arrangement of the said species is the two-wavelength VWM, in which two designated waveguides form the waveguide devices operating in two different wavelengths, $\lambda_1$ and $\lambda_2$, such that $\lambda_2 > \lambda_1$, are vertically integrated onto the same substrate, above the common waveguide which is connected to the shared optical input or output port, such that the designated waveguide with the shorter operating wavelength, hereafter referred to as the first designated waveguide, is positioned closer to the shared optical input or output port of the optical circuit and at the lower level in the epitaxial structure than the designated waveguide with the longer operating wavelength, hereafter referred to as the second designated waveguide.

The common waveguide in the two-wavelength VWM, as well as in any other VWM for this matter, is a passive waveguide by nature since its bandgap wavelength is well below any operating wavelength of the optical signals propagating within the VWM. As it concerns to the designated devices, these can be both passive (designated wavelength significantly shorter than the bandgap wavelength) or active waveguides (designated wavelength close to or above the bandgap wavelength) or any combination of passive and designated waveguides. Usually, passive waveguide serves to connect an input/output optical port of the PIC to other parts of the PIC, but it also may be a part of another integrated photonic circuit arrangement, such as a directional coupler or any kind of planar (de)multiplexer, which does not require optical-electrical or electrical-optical conversion for its operation. Usually, an active waveguide, which typically includes a PIN structure, oppositely serves to provide optical-electrical or electrical-optical conversion, such as generation (a laser) or detection (a photodetector) of the optical signals. In the exemplary embodiments of two-wavelength VWM described below, both designated waveguides are active waveguides but those with the skills in the art will easily see how the same design and operating principles are extended to passive waveguides or a combination of active and passive waveguides.

In a first exemplary embodiment of the two-wavelength VWM the first designated waveguide device is the laser and the second designated waveguide device is the photodetector, therefore enabling for the monolithically integrated bidirectional transceiver, in which incoming optical signals are received in the longer wavelength and outgoing optical signals are generated in the shorter wavelength. In the particular case of $\lambda_1=1310$ nm and $\lambda_2=1490$ nm (or alternatively 1555 nm). This embodiment relates to a single-fiber bi-directional optical transceiver for optical network unit (ONU) applications in fiber-to-the-home (FTTH) passive optical networks.

In a second exemplary embodiment of the two-wavelength VWM the first designated waveguide device is the detector and the second designated waveguide device is the laser, therefore enabling for the monolithically integrated inversed bidirectional transceiver, in which incoming optical signals are detected in the shorter wavelength and outgoing optical signals are generated in the longer wavelength. In the particular case of $\lambda_2=1490$ nm (or alternatively 1555 nm) and $\lambda_1=1310$ nm, this embodiment relates to the single-fiber bi-directional optical transceiver for optical line terminal (OLT) applications in FTTH passive optical networks.

In a third exemplary embodiment of the two-wavelength VWM both the first and the second designated waveguide devices are lasers, therefore enabling a monolithically integrated two-color transmitter, in which outgoing optical signals are independently generated in two distinct wavelength ranges.

In a fourth exemplary embodiment of the two-wavelength VWM, both the first and the second designated waveguide devices are the photodetectors, therefore enabling for the monolithically integrated two-color receiver, in which incoming optical signals are independently detected in two distinct wavelength ranges.

It would be evident to one skilled in the art that other combinations are possible of transmitter and receiver with multiple wavelengths, with further integration of multiple levels of either passive or active waveguides in between or a combination thereof.

BRIEF DESCRIPTION OF THE DRAWINGS

Exemplary embodiments of the invention will now be described in conjunction with the following drawings, in which:

FIG. 2a illustrates the optical signal flow in a two-wavelength receiver embodiment.

FIG. 2b illustrates the optical signal flow in a two-wavelength transmitter embodiment.

FIG. 2c illustrates the optical signal flow in a bidirectional transceiver with the shorter wavelength transmitter and longer wavelength receiver.

FIG. 2d illustrates the optical signal flow in a bidirectional transceiver with a shorter wavelength receiver and longer wavelength transmitter.

FIG. 3a defines the location of three cross-sections of the exemplary embodiment shown in FIG. 1, the cross sections being perpendicular to the direction of propagation.

FIG. 3b presents the two-dimensional profile of a guided optical mode in the first wavelength $\lambda_1=1310$ nm at the first cross section of the exemplary embodiment shown in FIG. 1. At this cross-section, the two-dimensional profile of the guided optical mode in second wavelength $\lambda_2=1555$ nm is similar to that in the first wavelength $\lambda_1=1310$ nm.

FIG. 3c presents the two-dimensional profile of a guided optical mode in the first wavelength $\lambda_1=1310$ nm as seen at the second cross section of the exemplary embodiment shown in FIG. 1.

FIG. 3d presents the two-dimensional profile of a guided optical mode in the second wavelength $\lambda_2=1555$ nm as seen at the second cross section of the exemplary embodiment shown in FIG. 1.

FIG. 3e presents the two-dimensional profile of a guided optical mode in the second wavelength $\lambda_2=1555$ nm as seen at the third cross section of the exemplary embodiment shown in FIG. 1.

DETAILED DESCRIPTION OF EMBODIMENTS OF THE INVENTION

Figure 1:
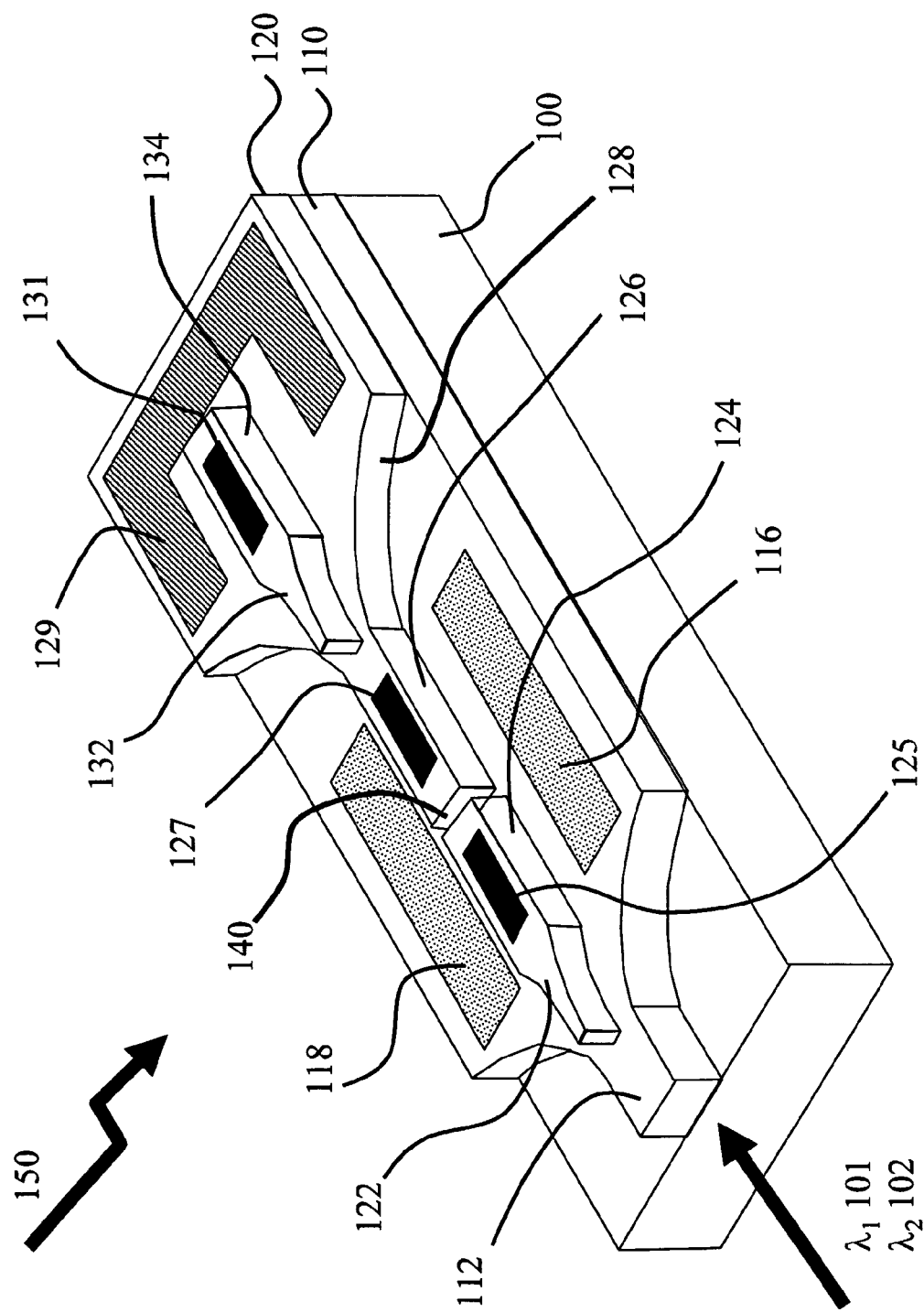
FIG. 1 presents a schematic three-dimensional view of an embodiment of the invention for providing a two-wavelength integrated VWM having one common and two designated waveguides.

FIG. 1 illustrates a schematic three-dimensional view of a first embodiment of the invention for providing a two-wavelength VWM 150 featuring one common waveguide 110 and two designated waveguides, 120 and 130, integrated onto the same semiconductor substrate 100.

Each of these three waveguides 110 to 130 has its guiding layer defined by a bandgap wavelength $\lambda_G$ that is longer than those in the surrounding cladding layers. The bandgap wavelength $\lambda_{G0}$ in the guiding layer of the common waveguide 110 is shorter than the bandgap wavelength $\lambda_{G1}$ of the first designated waveguide 120, which in turn is shorter than the bandgap wavelength $\lambda_{G2}$ of the second designated waveguide 130, i.e. $\lambda_{G0}<\lambda_{G1}<\lambda_{G2}$. In other words, all three waveguides 110 to 130 are integrated vertically and are differentiated by semiconductor processing steps longitudinally (i.e. in the direction of propagation) in order of increasing bandgap wavelength in their guiding layers.

Consider two operating wavelength ranges, centered on wavelengths $\lambda_1$ 101 and $\lambda_2$ 102, which for simplicity hereafter referred to as operating wavelengths $\lambda_1$ 101 and $\lambda_2$ 102. Both operating wavelengths $\lambda_1$ 101 and $\lambda_2$ 102 are longer than the bandgap wavelength of the common waveguide and close to or below the bandgap wavelengths in the guiding layers of their corresponding designated waveguides, i.e. $\lambda_{G0}<\lambda_{1(2)}\leq \lambda_{G1(2)}$ Those with skills in the art understand that the direct bandgap semiconductor from groups III and V has a refractive index, n, which depends on the relation between its bandgap wavelength $\lambda_G$ and the optical field wavelength $\lambda$, such that at any given $\lambda$, the longer $\lambda_G$ the higher n, whereas for any given $\lambda_G$, the longer $\lambda$ outside the narrow wavelength range of abnormal dispersion in the immediate vicinity of $\lambda=\lambda_G$, the lower n. Therefore, it is understood that in the waveguide arrangement illustrated by FIG. 1 that at any operating wavelength the guiding layer in each of three waveguides 110 to 130 has its refractive index higher than that in neighboring layers, which is a condition for a vertical confinement of the optical field around this layer.

However, this condition is not sufficient for such a confinement to actually occur. The ability of the guiding layer having its refractive index higher than those in neighboring layers to support a guided mode confined around this layer also depends on the lateral structure of the waveguide. In particular, said guiding layer in a ridge waveguide laterally defined by a vertical etch always supports at least one guided mode, if the etch stops above this layer, which case hereafter is referred to as the shallow etch ridge waveguide, but does not support any guided mode, if the etch goes through this layer, which case hereafter is referred to as the deep etch ridge waveguide, and the width of the ridge w is narrower than a certain critical cut-off width, $w_{CO}$. The last parameter depends on the wavelength, such that for a given layer structure and layout of the waveguide, $w_{CO}(\lambda)$ is narrower for shorter $\lambda$ and wider for longer $\lambda$, which allows for a wavelength-sensitive guiding, when for a given width of the ridge w, optical fields at the wavelength shorter than $\lambda_{CO}$, determined from the cut-off condition: $w_{CO}(\lambda_{CO})=w$, are guided and those at the longer wavelength are not.

The layer structure and layout of the waveguide arrangement illustrated in FIG. 1 are designed to have the shallow etch ridge waveguide 112 of the common waveguide 110, the deep etch ridge waveguides 122, 124, 126 for the first designated waveguide 120, and deep etch ridge waveguides 132 and 134 for the second designated waveguide 130, such that, in use, for any given polarization of light the common waveguide 110 supports only one guided optical mode in each of two wavelengths, $\lambda_1$ 101 and $\lambda_2$ 102;

the first designated waveguide 120 has the cut-off wavelength of its fundamental mode above the first wavelength $\lambda_1$ 101 but below the second wavelength $\lambda_2$ 102, i.e. $\lambda_1 < \lambda_{CO1} < \lambda_2$; and the second designated waveguide 130 has the cut-off wavelength of its fundamental mode above the second wavelength $\lambda_2$ 102, i.e. $\lambda_{CO2} > \lambda_2$. The first and the second designated waveguides, 120 and 130 respectively, can actually guide optical fields in their guiding layers only where these layers are present as a part of the deep etch ridge and where the width of the ridge is greater than the ridge's cut-off width.

Therefore, by designing the layer structure featuring the common and wavelength-designated waveguides such that a weakly guided optical mode in the common waveguide 110 is evanescently coupled to the designated waveguides above it, and, by lateral tapering the ridge layers in the designated waveguides 120 and 130, the conditions for an optical mode in the common waveguide 110 to be adiabatically transferred into the first and second designated waveguides 120, 130 can be created.

In the two-wavelength VWM 150, the first designated waveguide taper 122 in a combination with taper 112 at common waveguide layer 110 is used to adiabatically transfer the optical signal in the wavelength $\lambda_1$ 101 in either direction between the common waveguide 110 and first designated waveguide 120 and, likewise, the second designated waveguide taper 132, in a combination with further taper 128 at the first designated waveguide 120 ridge level underneath the second designated waveguide ridge, is used to adiabatically transfer the optical signal in the wavelength $\lambda_2$ in either direction between the common waveguide 110 and the second designated waveguide 130. The design of the layer structure and layout of the waveguides in accordance to this embodiment of the invention provides the monolithically integrated two-wavelength VWM 150, where two optical signals in distinct wavelength ranges, co- or bi-directionally propagating in the common waveguide, can be vertically (de)multiplexed (in) from two different wavelength-designated waveguides.

Additionally shown in this exemplary embodiment of FIG. 1 are designated contacts 125 and 127 in conjunction with ground contacts 116 and 118 for providing active functionality to the two different waveguide sections 124 and 126, for example laser diode and rear-facet monitor photodiode respectively, of the first designated waveguide 120 which are electrically isolated from each other by narrow deep trench 140. The second designated waveguide 130 being shown with a single ground contact 129 and single drive contact 131, such as for example in a photodetector.

Now, referring to FIG. 2a, illustrated is the optical signal flow of a first potential configuration of a two wavelength VWM 150 as illustrated in FIG. 1. Referring to FIG. 2a is shown a two-wavelength receiver embodiment wherein a shorter wavelength signal 211, for example $\lambda_1$=1310 nm, is coupled to the lower first designated waveguide 120 and absorbed. A second longer wavelength optical signal 212, for example $\lambda_2$=1555 nm, entering the device through the common optical port attached to a common waveguide 110, passes the first designated waveguide without being significantly affected by the it and then is coupled to the upper second designated waveguide 130 and absorbed therein.

FIG. 2b illustrates the optical signal flow of a second potential configuration of a two wavelength VWM 150 as illustrated in FIG. 1. Referring to FIG. 2b is shown a two-wavelength transmitter embodiment wherein a shorter wavelength signal 221, for example $\lambda_1$=1310 nm, is generated within the lower first designated waveguide 120 and coupled into the common waveguide 110. A second longer wavelength optical signal 222, for example $\lambda_2$=1555 nm, is generated within the upper second designated waveguide 130 and is similarly coupled into the common waveguide 110, through which it reaches the common optical port without being significantly affected by the first designated waveguide.

FIG. 2c illustrates the optical signal flow in the third potential configuration of the two wavelength VWM 150 wherein it is configured as the ONU bidirectional transceiver. Here, the first shorter wavelength optical signal 231, for example $\lambda_1$=1310 nm, is generated within the lower first designated waveguide 120 and coupled into the common waveguide 110 for transmission from the two-wavelength VWM 150. The second longer wavelength optical signal 232, for example $\lambda_2$=1555 nm, is coupled through the common optical port into the VWM common waveguide 110 of the two-wavelength VWM 150, where it propagates without being significantly affected by the first designated waveguide until it is coupled into the upper second designated waveguide 130 and absorbed therein.

FIG. 2d illustrates the optical signal flow in the fourth potential configuration of the two-wavelength VWM 150 wherein it is configured as the OLT bidirectional transceiver. Here, the first shorter wavelength optical signal 241, for example $\lambda_1$=1310 nm, is coupled into the common waveguide 110 of the two wavelength VWM 150 and then into the lower first designated waveguide 120 where it is absorbed. The second longer wavelength optical signal 242, for example $\lambda_2$=1555 nm is generated within the upper second designated waveguide 130 and is then coupled into the common waveguide 110, where it propagates to the optical port without being significantly affected by the first designated waveguide, for transmission from the two-wavelength VWM 150.

Figure 2E:
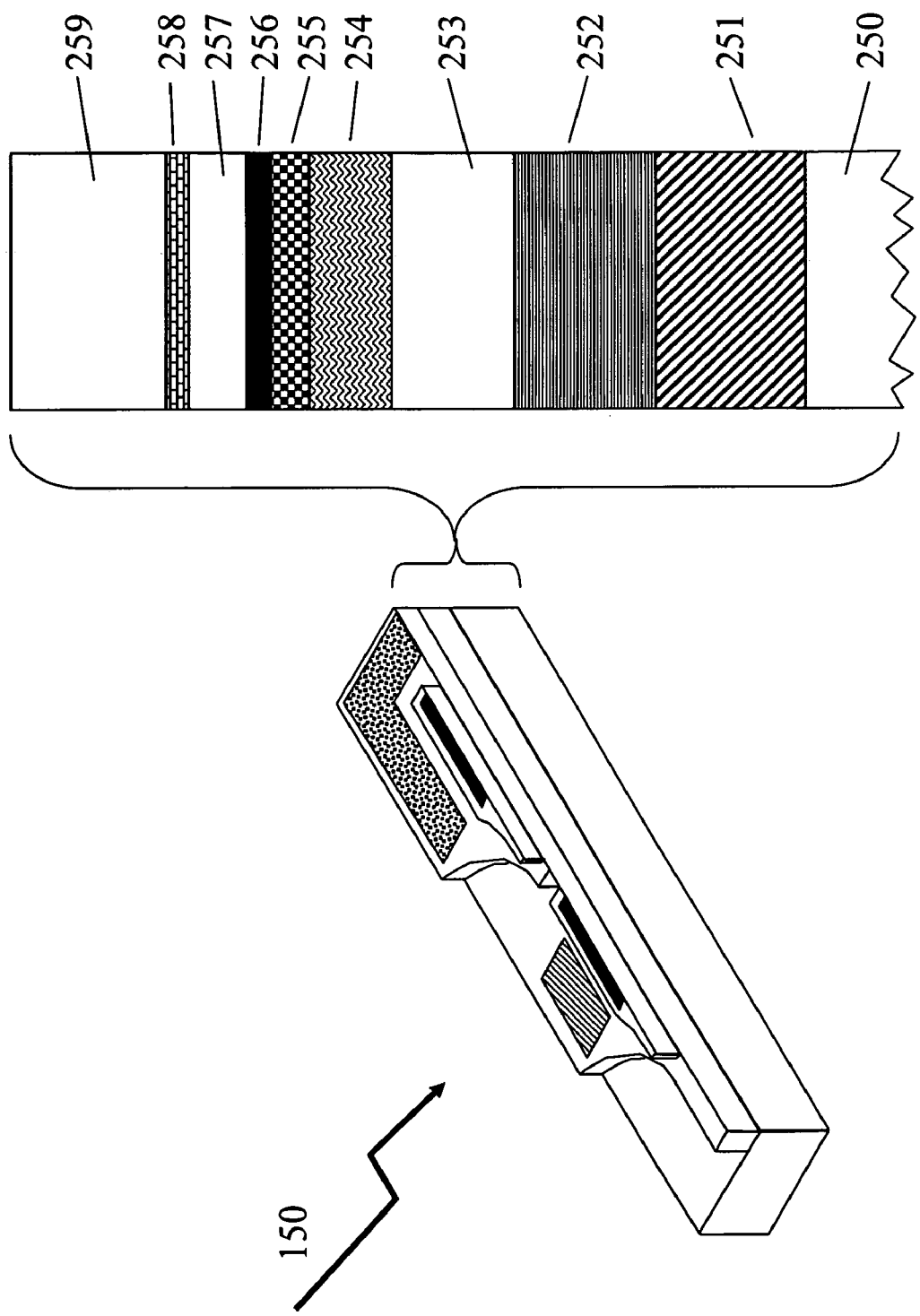
FIG. 2e illustrates an exemplary epitaxial structure for an embodiment of the diplexer of FIG. 1.

Further details are given referring to the exemplary layer structure shown in FIG. 2e which facilitates the layout of the first embodiment of the invention outlined in FIG. 1, the two-wavelength VWM 150 as relates to the ONU bidirectional transceiver configuration of FIG. 2c. The two-wavelength VWM 150 providing a 1310 nm laser for generating outgoing optical signals and a 1555 nm photodetector for receiving incoming optical signals. The device structure being grown on a semi-insulating InP substrate 250 and comprising:

| | |
|---|---|
| Layer 251 | 1 μm-thick, unintentionally doped InP buffer layer; |
| Layer 252 | 0.6 μm-thick, unintentionally doped GaInAsP ($\lambda_G$ = 1000 nm) guiding layer of the common waveguide 110; |
| Layer 253 | 0.4 μm-thick, heavy N-doped InP optical isolation/electrical N-contact layer; |
| Layer 254 | 0.2 μm-thick, N-doped GaInAsP ($\lambda_G$ = 1000 nm) separate confinement heterostructure guiding layer of the first designated waveguide 120; |
| Layer 255 | 0.11 μm-thick, unintentionally doped GaInAsP/GaInAsP strain-compensated multiple quantum well ($\lambda_G$ = 1310 nm) guiding layer of the first designated waveguide 120; |
| Layer 256 | 0.1 μm-thick, P-doped GaInAsP ($\lambda_G$ = 1000 nm) separate confinement heterostructure guiding layer of the first designated waveguide 120; |
| Layer 257 | 0.4 μm-thick, heavy P-doped InP optical isolation/electrical P-contact layer; |
| Layer 258 | 0.085 μm-thick, unintentionally doped GaInAs ($\lambda_G$ = 1654 nm) guiding layer of the second designated waveguide 130; |
| Layer 259 | 1.5 μm-thick, heavy N-doped InP optical cladding/electrical N-contact layer. |

Referring to the FIG. 1, the deep etch ridge 134 of the second designated waveguide 130 and its taper 132 both defined by etching from the top surface, through layers 258 and 259, down to the top of the layer 257. The deep etch ridges 124 and 126 of the first designated waveguide 120, as well as the corresponding taper 122, are all defined by etching from the top of the layer 257, through layers 254 to 257, down to the top of the layer 253. Finally, the shallow etch ridge 112 of the common waveguide 110 is defined by etching from the top of the layer 253, through this layer, down to the top of the layer 252.

For the two-wavelength VWM 150 with the exemplary layer structure above, the widths of the straight portions of the common, the first and the second designated waveguide ridges 110, 120, and 130 are 4.0 μm, 2.2 μm and 4.5 μm, respectively. The width of the lateral taper in each of the designated waveguides 120 and 130 gradually changes from that in the straight portion down to approximately 0.5 μm at the tip of the tapers 122 and 132.

The laser cavity of the vertically integrated laser, within first designated waveguide 120 can be formed for example by providing distributed Bragg reflectors etched in layer 257, on both sides of the laser's P-contact 125. It is advantageous to have a back-end power monitor for controlling the laser output, which in a case of the integrated device outlined in FIG. 1 is easily arranged by optical butt-coupling the monitor to the laser, as the two share the same first designated waveguide 120. Electrically insulating the laser and monitor sections, 124 and 126 respectively, is achieved by a narrow deep trench 140 going down to the N-contact layer 253 and tilted at an angle of approximately 7-8 degrees with respect to the plane perpendicular to the propagation direction Those with skills in the art understand that the material system, layer structure and layout of the integrated component determined by the application and performance objectives of the PIC and are not limited to this exemplary embodiment. For example, instead of the longer operating wavelength being in the 1555 nm range, the same principles can be used for designing a device with the longer operating wavelength in 1490 nm range; or instead of using only GaInAsP quaternary materials in the device's layer structure, GaAlInAs quaternaries can be added to the layer structure, specifically, to form the quantum-well active region of the laser operating in 1310 nm wavelength range.

Now, referring to FIG. 3a, the two-wavelength VWM 150 is again displayed with the location of three cross-sections 301-303, with each cross section being perpendicular to the direction of propagation. First cross-section 301 is positioned within the section of the two-wavelength VWM 150 wherein both optical signals $\lambda_1$ 101 and $\lambda_2$ 102 are confined within the common waveguide 110. Second cross-section 302 is positioned within the section of the two-wavelength VWM 150 wherein the first optical signal $\lambda_1$ 101 is vertically confined in first designated waveguide 120, whereas the second optical signal $\lambda_2$ 102 is still confined within the common waveguide 110. Finally, third cross-section 303 is positioned within the section of the two-wavelength VWM 150 wherein the second optical signal $\lambda_2$ 102 is now confined within the second designated waveguide 130. Optical mode profiles of $\lambda_1$ 101 and $\lambda_2$ 102 at each cross-section presented below in respect of FIGS. 3b through 3e.

Shown in FIG. 3b is the waveguide cross-section 301 of the exemplary two-wavelength VWM 150 overlapped with the two-dimensional mode profiles corresponding to the optical signals in the first and second wavelengths, $\lambda_1$=1310 nm 101 and $\lambda_2$=1555 nm 102, respectively. It can be seen that the common waveguide 110 supports only one guided mode profile 310, in each of two operating wavelengths, with the mode shape having little difference between the two.

However, the situation is very different in the second cross-section 302 wherein referring to FIG. 3c, the only two-dimensional mode supported at the wavelength $\lambda_1$=1310 nm 101 is the mode vertically confined around the guiding layer of this waveguide, as shown by mode profile 320 and, therefore, coupled into the deep etched ridge of the first designated waveguide. In contrast, FIG. 2d shows the two-dimensional mode at the wavelength $\lambda_2$=1555 nm 102, which is still vertically confined in the guiding layer of the common waveguide 110 and interacts with the ridge of first designated waveguide 120 only through its evanescent field.

Therefore, while the confinement factor of the guided mode with the guiding layer of the first designated waveguide 110 is high for the first wavelength $\lambda_1$=1310 nm 101, it simultaneously can be maintained at a very low, e.g. below 1%, level for the second wavelength $\lambda_2$=1555 nm 102. This allows for the wavelength $\lambda_2$=1555 nm 102 in the common waveguide 110 to propagate further along the two-wavelength VWM 150 and reaching the second designated waveguide 120, without any significant interaction with the first designated waveguide 110.

Referring to FIG. 3e, shown is the third cross-section 303 where the second designated waveguide 130 has a deep etched ridge high and wide enough to support the optical mode in the wavelength $\lambda_2=1555$ nm 102, which is strongly vertically confined in its guiding layer as evidenced from the mode profile 330.

Figure 4:
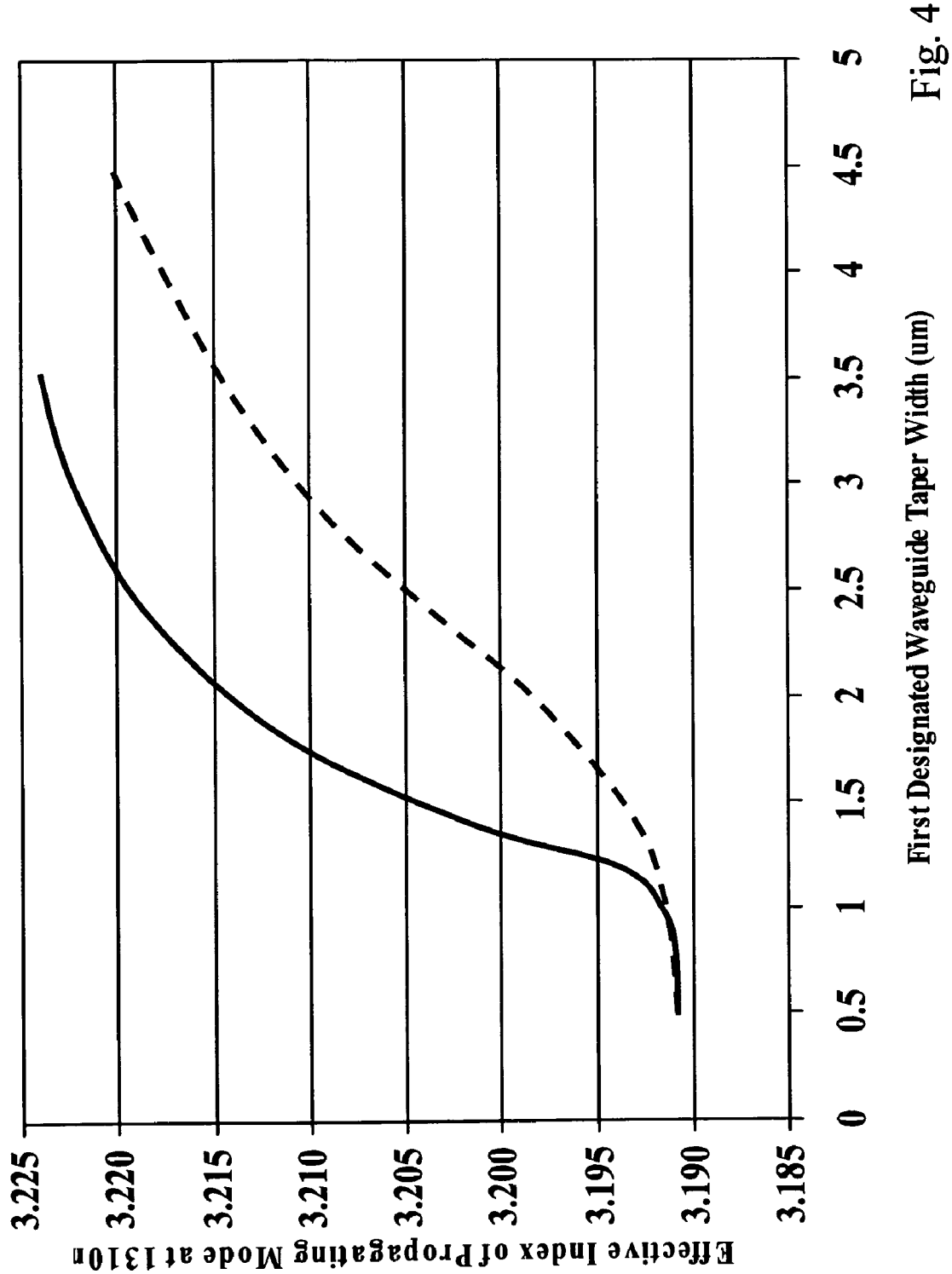
FIG. 4 presents the effective index of the propagating mode in the first and second wavelengths, $\lambda_1=1310$ nm and $\lambda_2=1555$ nm, respectively, plotted as functions of the first designated waveguide's taper width in the embodiment of the invention detailed in FIG. 2.

Now, referring to FIG. 4, the transfer of the optical signal from common to designated waveguide illustrated by providing a calculated dependence 400 of the effective index of the propagating mode in each of two wavelengths, $\lambda_1=1310$ nm 101 and $\lambda_2=1555$ nm 102, on the width of the first designated waveguide's taper. The layer structure and layout of the integrated component used in these simulations are those of a two-wavelength VWM detailed in FIGS. 2e and 2a, respectively.

As clearly seen from the plot 400, each of two curves presented in FIG. 4 demonstrates a transition between two distinct states with the lower and higher effective index, caused by the change of the width of the waveguide's deep etched ridge. The former corresponds to the optical mode mainly confined in the common waveguide and the latter—to the optical mode predominantly confined into the guiding layer of the first designated waveguide. In either state, the effect of the ridge's width on the effective index of the mode is not very significant, because of the optical field is strongly vertically confined in the guiding layer below (lower state) or within (upper state) the ridge. In the transition range, however, change in the effective index caused by altering the ridge's width indeed is very significant, since this is the region where optical field of the propagating mode is transitioned from one vertically confined mode (in the common waveguide) into the other (in the first designated waveguide).

What is important to point to in the plot 400 presented in FIG. 4, is the shift of the transition region for the propagating mode in the second wavelength $\lambda_2=1555$ nm 102 with respect to that in the first wavelength $\lambda_1=1310$ nm 101. It is seen from the FIG. 4 that the higher effective index state, which corresponds to the propagating mode confined predominantly in the guiding layer of the first designated waveguide, is not reached for the second wavelength $\lambda_2=1555$ nm 102 until the ridge's width exceeds 4.0 μm-4.5 μm, as evident from second wavelength curve 402. In contrast, for the first wavelength $\lambda_1=1310$ nm 101, it is reached if the same ridge's width exceeds just 2.0 μm-2.5 μm, as evident from first wavelength curve 401.

For an exemplary embodiment having the width of the straight portion of the first designated waveguide 120 of 2.2 μm, simulated herein, the effective index of the propagating mode in the second wavelength $\lambda_2=1555$ nm 102 is about 0.06 below its value in the upper state, which needs to be reached for having the optical field in this wavelength vertically confined in the guiding layer of the first designated waveguide 120. This is quite a substantial difference in the effective index of the propagating mode, which allows for a confident vertical (de)multiplexing of the wavelengths $\lambda_1=1310$ nm 101 and $\lambda_2=1555$ nm 102, even in a view of unavoidable fabrication tolerances. Simulations indicate that a total insertion loss for the optical signal in the second wavelength $\lambda_2=1555$ nm 102 transferred from the common waveguide 110 to the second designated waveguide 130 in the exemplary two wavelength VWM 150, can be reduced to below 1 dB.

The numerical simulations underlying the exemplary 2-dimensional profiles and effective index of the propagating mode in the two-wavelength VWM illustrated by FIGS. 3 and 4 are based on use a commercial beam propagation method simulator and microscopic calculations of the optical properties of multi-layer heterostructures described in a reference: V. I. Tolstikhin, "Optical properties of semiconductor heterostructures for active photonic device modeling," *J. Vac. Science & Technology A*, Vol. A18, pp. 605-609, 2000.

Low insertion loss of the photodetector is an advantage of the embodiment of the invention in the form of an integrated ONU diplexer over prior art approaches, in which shorter wavelength laser and longer wavelength photodetector are either in-line butt-coupled by using multiple growth step techniques, see for example Koch et al. in U.S. Pat. No. 5,031,188, or vertically evanescent-field coupled by using one-step epitaxial growth, see for example O'Donnell et al, US Patent Application US/2005/0249504. In each prior art approach longer wavelength optical signal is propagated all the way through the laser's active waveguide before it gets coupled into the photodetectors active waveguide.

Because of the significant free carrier, primarily intervalence band (e.g. J. Taylor and V. I. Tolstikhin, "Intervalence band absorption in InP and related materials for optoelectronic device modeling," *J. Appl. Phys*. Vol. 87, pp. 1054-1059, 2000) absorption in the active and heavily doped contact layers of the laser's and laser monitor's waveguides results in unacceptably high insertion loss for the photodetector, even though the optical signals in the longer wavelength operating range of photodetector do not experience direct interband absorption when passing through the shorter bandgap wavelength laser's and laser monitor's waveguides. The exemplary embodiments presented supra eliminate this by virtue of the longer wavelength optical signal being sustained within the common waveguide and not coupling via the shorter wavelength designated waveguides.

It is clear to those skilled in the art that the basic principles of the vertical (de)multiplexing as disclosed above referring to FIGS. 1-3 and illustrated by the results of numerical simulation of an exemplary two-wavelength VWM structure detailed in FIG. 2e, are not limited to these embodiments and, to the contrary, are generic to the integrated-optics arrangements featuring one common and two designated waveguides of the said species. Various modifications of the layer structure and layout of the two-wavelength VWM, e.g. aimed at achieving specific performance targets, are conceivable within the framework of the same basic design and operating principles.

Figure 5:
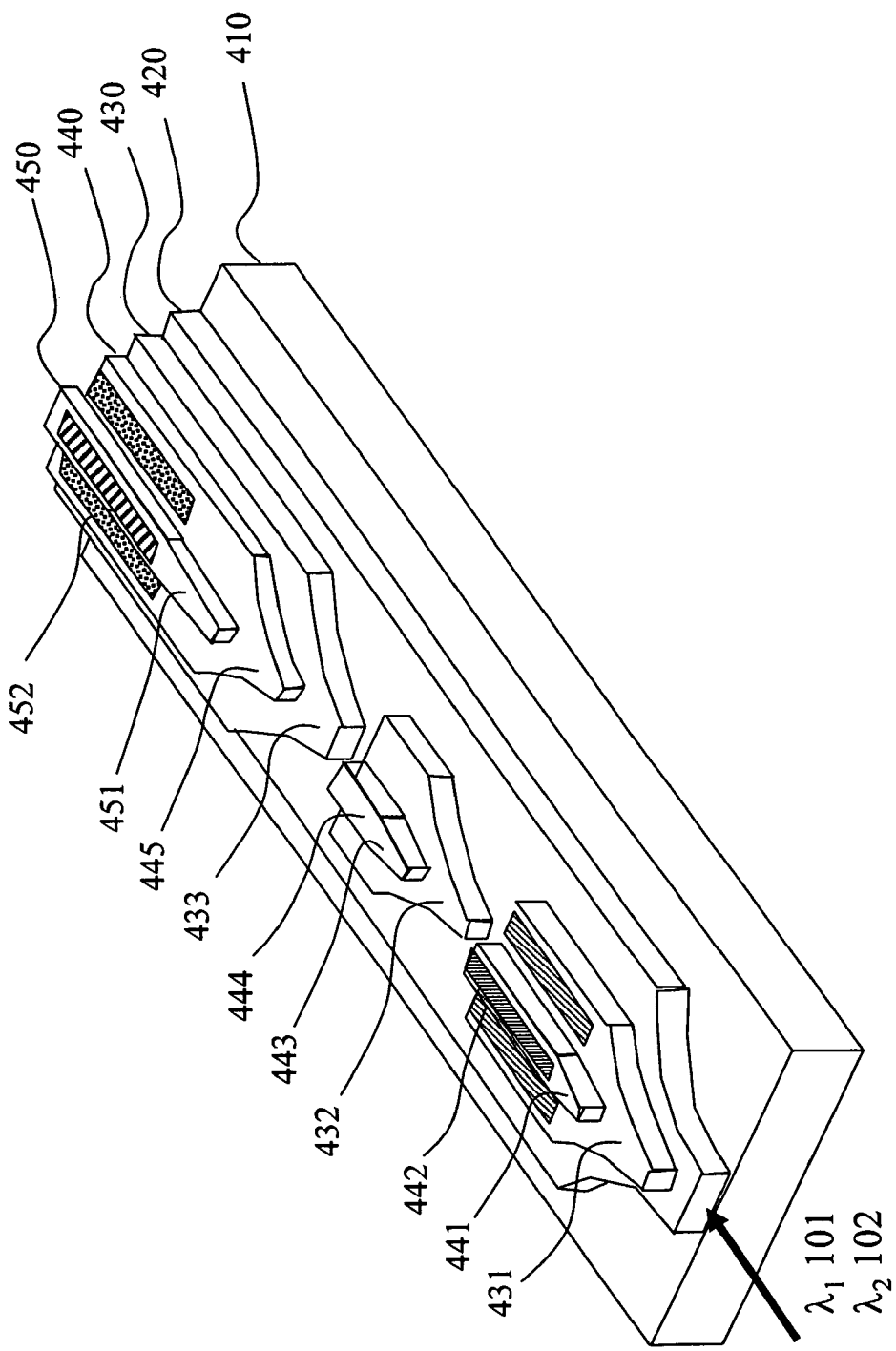
FIG. 5 presents a schematic three-dimensional view of another exemplary embodiment of the invention providing a two-wavelength integrated VWM with improved filtering properties.

FIG. 5 illustrates a schematic view of such a modifications of the first embodiment of the invention for providing a two-wavelength integrated VWM 500, aimed at improving its wavelength filtering properties and, therefore, reducing possible cross-talk between the optical signals in two wavelength—a very important practical problem to solve, especially in a transceiver configuration where one (transmitted) signal is much stronger than the other (received) signal.

In one modification, the first designated waveguide is composed of two vertically stacked guiding layers, first dual core layer 530 and second dual core layer 540, each capable of supporting the vertically confined optical mode centered in this layer, of which at least the lower one is the passive waveguide having its bandgap wavelength well below the first (shortest) operating wavelength. Referring to FIG. 5, in the vertical stack of the two-wavelength integrated VWM 500 this dual-core first designated layer is still positioned above the common waveguide 520 and below the second designated waveguide 550. However, a dual-core waveguide allows for two step lateral tapering which adds to the device flexibility and provides an ability for the optical signal in the designated wavelength to be adiabatically transitioned from the common waveguide 520 into the second dual core layer 540 with minimal insertion loss (e.g. F. Wu, V. Tolstikhin, et al, Two-Step Lateral Taper Spot-Size Converter for Efficient Coupling to InP-Based Photonic Integrated Circuits, *Proceed. SPIE*, Vol. 5577, PP. 213-220, 2004).

As shown the first device element 560, for example an optical emitter or photodetector processing the first optical signal $\lambda_1$=1310 nm 101, within the two-wavelength integrated VWM 500 is formed from first dual core taper 531 within the first dual core layer 530, second dual core taper 541 and first dual core element 542 within the second dual core layer 540. The second device element, for example a photodetector processing the second optical signal $\lambda_2$=1555 nm 102, within the two-wavelength integrated VWM 500 is formed from third dual core taper 533 within the first dual core layer 530, fourth dual core taper 545 within the second dual core layer 540, first designated taper 551 and first designated device section 552 within the second designated waveguide 550.

In the other modification of two-wavelength integrated VWM 500 from two-wavelength VWM 150, an additional element 570 is inserted between the first device element 560 and second device element 580. The additional element being inserted between the end of the first designated waveguide, formed from the dual core layers 530 and 540, and start of the second designated waveguide 550 in the direction of propagation. As shown the additional element 570 comprising fifth dual core taper 532 in the first dual core layer 530, sixth dual core taper 543 in the second dual core layer 540, and second dual core element 544, also within the second dual core layer 540. In a case when the first designated waveguide is the active waveguide featuring lasing or absorbing function, this additional element, which may or may not have contacts on it, provides a PIC designer with a method, controllable, if the contacts are added to second dual core element 544, to absorb residual optical signal in the first wavelength $\lambda_1$=1310 nm 101 while leaving unaffected the optical signal in the second wavelength $\lambda_2$=1555 nm 102. This, may for example be used for improving the filtering properties of the two-wavelength integrated VWM 500 and reducing the crosstalk of the first wavelength $\lambda_1$=1310 nm 101 into the second wavelength $\lambda_2$=1555 nm 102. Alternatively, the first device element 560 may be specifically designed for extracting and processing a significant portion of the first wavelength $\lambda_1$=1310 nm 101, such as detecting the encoded digital data with a high speed photoreceiver, and providing the remaining portion of the first wavelength $\lambda_1$=1310 nm 101 to the additional element 570, such as providing a low speed monitoring signal for controlling an aspect of operation of the two-wavelength integrated VWM 500 or the optical module within which it is operating.

It should be evident to those skilled in the art that either of the two modifications above or both of them can be added to the VWM design as required, without altering the design and operating principles of this integrated component.

Furthermore, any generalization towards triple or multiple core first designated waveguide and two or more additional elements of it in front of the second designated waveguide are possible within the same design and operating principles of the integrated VWM. Equally, the embodiments presented supra may be extended to providing increased numbers of discrete wavelengths, or wavelength bands, upon which the VWM operates. Examples of such VWM devices including Coarse Wavelength Division Multiplexing (CWDM) and Dense Wavelength Division Multiplexing (DWDM).

Numerous other embodiments may be envisaged without departing from the spirit or scope of the invention.

What is claimed is:

1. An integrated-photonics arrangement implementable in a III-V semiconductor material system comprising:
    a semiconductor substrate for supporting epitaxial semiconductor growth;
    an epitaxial semiconductor structure grown on the semiconductor substrate in one growth step, the epitaxial semiconductor structure for forming a plurality of vertically stacked optical waveguides integrated onto the substrate;
    a plurality of vertically stacked optical waveguides formed in the epitaxial semiconductor structure, each vertically stacked optical waveguide laterally defined by at least a semiconductor etching process, and comprising:
        a common waveguide, the common waveguide being at a predetermined position at an extreme of the plurality of vertically stacked optical waveguides within the epitaxial semiconductor structure, for supporting propagation of optical signals within a predetermined first wavelength range, and characterized by at least a bandgap wavelength, the bandgap wavelength of the common waveguide being shorter than any wavelength within the predetermined first wavelength range,
        a plurality of wavelength-designated waveguides, each characterized by at least a bandgap wavelength, for at least one of propagating, generating, amplifying, modulating, and detecting optical signals within a plurality of predetermined second wavelength ranges, the predetermined second wavelength ranges being within the predetermined first wavelength range and each being associated with a wavelength-designated waveguide of the plurality of wavelength-designated waveguides, the plurality of wavelength-designated waveguides being formed in the semiconductor epitaxial structure and vertically disposed away from the common waveguide in order of increasing bandgap wavelength thereof, each wavelength-designated waveguide of the plurality of wavelength-designated waveguides being optically aligned with the common waveguide for a predetermined distance, and
    at least one lateral taper formed within each wavelength-designated waveguide for transferring optical signals between the vertically stacked optical waveguides, the lateral taper defined by at least one semiconductor etching process, wherein
    when in use, an optical signal in each predetermined second wavelength range is coupled between the common waveguide and corresponding wavelength-designated waveguide without being significantly at least one of altered and affected by any other wavelength-designated waveguide.

2. An integrated-photonics arrangement according to claim 1 wherein, when in use, an optical signal propagating within the common waveguide and having a wavelength within one predetermined second wavelength range of the plurality of predetermined second wavelength ranges is adiabatically transferred into one wavelength-designated waveguide of the plurality of wavelength-designated waveguides, the one wavelength-designated waveguide being determined in dependence of at least the wavelength being within the second wavelength range of the one wavelength-designated waveguide.

3. An integrated-photonics arrangement according to claim 2 wherein:
    at least one wavelength-designated waveguide of the plurality of wavelength-designated waveguides comprises at least one of a semiconductor optical detector and a semiconductor optical amplifier.

4. An integrated-photonics arrangement according to claim 1 wherein, when in use, an optical signal propagating within one wavelength-designated waveguide of the plurality of wavelength-designated waveguides and having a wavelength within the predetermined second wavelength ranges of the one wavelength-designated waveguide of the plurality of wavelength-designated waveguides is adiabatically transferred into the common waveguide.

5. An integrated-photonics arrangement according to claim 4 wherein:
   at least one wavelength-designated waveguide of the plurality of wavelength-designated waveguides comprises at least one of a semiconductor optical modulator and a semiconductor optical emitter.

6. An integrated-photonics arrangement according to claim 1 wherein, when in use, a first optical signal propagating within the common waveguide and having a first wavelength within one predetermined second wavelength range of the plurality of predetermined second wavelength ranges is adiabatically transferred into one wavelength-designated waveguide of the plurality of wavelength-designated waveguides, the one wavelength-designated waveguide being determined in dependence of at least the first wavelength being within the second wavelength range of the one wavelength-designated waveguide; and
   a second optical signal propagating within another wavelength-designated waveguide of the plurality of wavelength-designated waveguides and having a second wavelength within the predetermined second wavelength range of the another one wavelength-designated waveguide of the plurality of wavelength-designated waveguides is adiabatically transferred into the common waveguide.

7. An integrated-photonics arrangement according to claim 6 wherein:
   at least one of the plurality of wavelength-designated waveguides comprises at least one of a semiconductor optical emitter, a semiconductor optical detector, a semiconductor optical amplifier, and a semiconductor optical modulator.

8. A method of processing optical signals using an integrated-photonics arrangement implementable in a III-V semiconductor material system comprising:
   providing a semiconductor substrate for supporting epitaxial semiconductor growth;
   growing an epitaxial semiconductor structure on the semiconductor substrate in one growth step, the epitaxial semiconductor structure for forming a plurality of optical waveguides vertically integrated onto the semiconductor substrate; and
   providing a plurality of vertically stacked optical waveguides formed in the epitaxial semiconductor structure, each of the plurality of vertically stacked optical waveguides laterally defined by at least a semiconductor etching process, and comprising:
   a common waveguide, the common waveguide being at a predetermined position at an extreme of the vertically stacked waveguides within the epitaxial semiconductor structure, for supporting propagation of optical signals within a predetermined first wavelength range, and characterized by at least a bandgap wavelength, the bandgap wavelength of the common waveguide being shorter than any wavelength within the predetermined first wavelength range,
   a plurality of wavelength-designated waveguides, each characterized by at least a bandgap wavelength, for at least one of propagating, generating, amplifying, modulating, and detecting optical signals within a plurality of predetermined second wavelength ranges, the predetermined second wavelength ranges being within the predetermined first wavelength range and each being associated with a wavelength-designated waveguide of the plurality of wavelength-designated waveguides, the plurality of wavelength-designated waveguides being formed in the semiconductor epitaxial structure and vertically disposed away from the common waveguide in order of increasing bandgap wavelength thereof, each wavelength-designated waveguide of the plurality of wavelength-designated waveguides being optically aligned with the common waveguide for a predetermined distance, and
   at least one lateral taper formed within each wavelength-designated waveguide for transferring optical signals between the vertically stacked optical waveguides, the lateral taper defined by at least one semiconductor etching process, wherein
   propagating an optical signal in each predetermined second wavelength range results in the optical signal being coupled between the common waveguide and corresponding wavelength-designated waveguide without being significantly at least one of altered and affected by any other wavelength-designated waveguide.

9. A method of processing optical signals according to claim 8 wherein:
   at least one of the plurality of wavelength-designated waveguides comprises at least one of a semiconductor optical amplifier, a semiconductor optical emitter, a semiconductor optical detector, and a semiconductor optical modulator.

* * * * *